United States Patent
Su et al.

(10) Patent No.: US 11,494,526 B2
(45) Date of Patent: *Nov. 8, 2022

(54) OPTIMIZATION OF PYROLYSIS TUBE CRACKING EFFICIENCY

(71) Applicant: HZO, Inc., Morrisville, NC (US)

(72) Inventors: Tining Su, Draper, UT (US); Yang Yun, Draper, UT (US)

(*) Notice: Subject to any disclaimer, the term of this patent is extended or adjusted under 35 U.S.C. 154(b) by 3 days.

This patent is subject to a terminal disclaimer.

(21) Appl. No.: 16/932,395

(22) Filed: Jul. 17, 2020

(65) Prior Publication Data

US 2021/0012038 A1      Jan. 14, 2021

Related U.S. Application Data

(63) Continuation of application No. 15/147,659, filed on May 5, 2016, now Pat. No. 10,719,634.

(60) Provisional application No. 62/157,056, filed on May 5, 2015.

(51) Int. Cl.
*G06F 30/00* (2020.01)
*C10G 9/20* (2006.01)

(52) U.S. Cl.
CPC .............. *G06F 30/00* (2020.01); *C10G 9/20* (2013.01)

(58) Field of Classification Search
CPC .................................. G06F 17/50; C10G 9/20
See application file for complete search history.

(56) References Cited

U.S. PATENT DOCUMENTS

2006/0129007 A1    6/2006  Jo et al.
2012/0193269 A1    8/2012  Taha et al.
2013/0032761 A1    2/2013  Fan et al.
2015/0211115 A1    7/2015  Dempster et al.
2016/0168479 A1    6/2016  Spicer et al.

FOREIGN PATENT DOCUMENTS

CN          203524284 A       1/2014

OTHER PUBLICATIONS

Copenheaver "PCT International Search Report for International Application No. PCT/US2016/031018" dated Aug. 9, 2016, 2 pages.
Copenheaver "Written Opinion of the International Searching Authority for International Application No. PCT/US2016/031018" dated Aug. 9, 2016, 4 pages.
Notice of Allowance for U.S. Appl. No. 15/147,659, dated Apr. 6, 2020, 9 pages.

(Continued)

*Primary Examiner* — Umut Onat
*Assistant Examiner* — Kimberly L Jordan
(74) *Attorney, Agent, or Firm* — Intellectual Strategies (57) ABSTRACT

A method for optimizing a cracking efficiency with which a pyrolysis tube of a deposition apparatus cracks a precursor material into reactive species is disclosed, including measuring an input pressure at an entrance to the pyrolysis tube, outside of the pyrolysis tube; measuring an output pressure at an exit from the pyrolysis tube, outside of the pyrolysis tube; measuring a pyrolysis temperature within the pyrolysis tube; calculating a cracking efficiency based on the input pressure, the output pressure and the pyrolysis temperature; and determining an adjustment to be made to at least one of the input pressure, the output pressure and the pyrolysis temperature to increase the cracking efficiency.

8 Claims, 9 Drawing Sheets

(56) References Cited

OTHER PUBLICATIONS

Office Action for U.S. Appl. No. 15/147,659, dated Aug. 10, 2018, 7 pages.
Office Action for U.S. Appl. No. 15/147,659, dated Mar. 8, 2019, 6 pages.
Office Action for U.S. Appl. No. 15/147,659, dated Sep. 23, 2019, 4 pages.

OPTIMIZATION OF PYROLYSIS TUBE CRACKING EFFICIENCY

CROSS-REFERENCE TO RELATED APPLICATIONS

This application claims priority to U.S. Provisional Patent Application No. 62/157,056 filed on May 5, 2015, entitled "Optimization of Pyrolysis Tube Cracking Efficiency," which is hereby incorporated by reference in its entirety herein.

BACKGROUND

Technical Field

This disclosure relates generally to techniques for optimizing the efficiency with which a pyrolysis tube of a material deposition apparatus operates and, more specifically, to methods for optimizing the efficiency with which a pyrolysis tube cracks a precursor material, such as a parylene dimer.

Related Art

Various material deposition processes require that a precursor material be pyrolyzed into activated species. The activated species then react with one another to form a polymer. Polymerization may occur on the surface of a substrate and, thus, the polymer is said to be deposited onto the substrate.

Figure 1A:
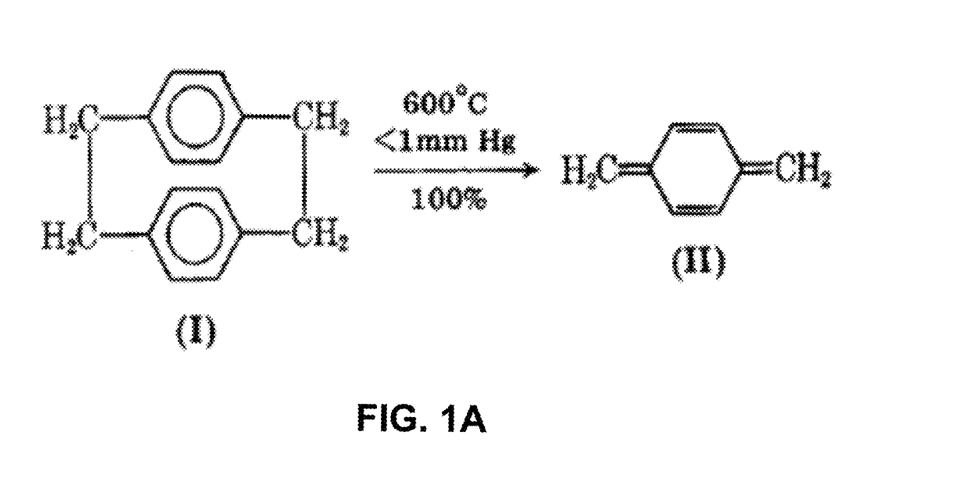
FIGS. 1A and 1B are representations of the processes used to produce a polymer in accordance with the prior art.
Figure 1B:
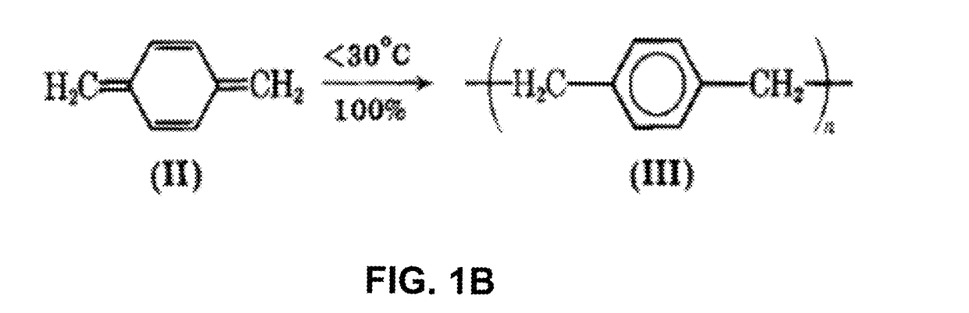

These general processes are used to deposit parylene (unsubstituted or substituted poly (p-xylylene)) films. Typically, the precursor material used for a parylene film is a [2.2]paracyclophane dimer. Pyrolysis of the dimer, and the subsequent deposition of a parylene thin film is a complicated dynamical process that includes the following steps:

During pyrolysis, the two strained C—C bonds of the dimer shown in FIG. 1a are cleaved to yield two di-radicals, or "monomers." This reaction typically occurs inside a pyrolyzer at a temperature of about 600° C. In FIG. 1b, the activated monomer molecules that were created within the pyrolyzer are introduced into a deposition chamber, and condense onto a surface of a substrate within the deposition chamber. The monomers polymerize on the surface to produce a polymer coating.

SUMMARY

This disclosure relates to a method that may be used to optimize the efficiency with which a pyrolyzer cracks a precursor material, such as a parylene dimer.

In one aspect, a model according to this disclosure may be used to determine one or more constants that correspond to a particular pyrolyzer or to material deposition equipment of which the pyrolyzer is a part. When these constants are known, they may be used in a manner that enables fine tuning of one or more pyrolyzer parameters to optimize cracking efficiency. Without limitation, an embodiment of the model and the one or more constants may be used to identify an optimal amount of time a precursor material remains within a pyrolyzer, or a "residence time," and/or an optimal temperature at which the pyrolyzer cracks the precursor material.

In another aspect, a model according to this disclosure may be used to optimize a cracking efficiency of a pyrolyzer or of material deposition equipment of which the pyrolyzer is a part. More specifically, knowing one or more pyrolyzer-specific constants that correspond to cracking efficiency, the residence time and/or the temperature of a pyrolyzer may be set for a specific precursor material. The precursor material may then be introduced into the pyrolyzer, which cracks the precursor material at a desired efficiency. The active species, or monomers, that result from such cracking may then be deposited onto a substrate to provide a polymer coating with desired characteristics. An optimized cracking efficiency may also minimize the need for cleaning and/or maintenance of the material deposition equipment.

In some embodiments, one or more parameters that affect cracking efficiency may be controlled in real-time as precursor material is being processed (e.g., pyrolyzed, etc.) and a polymer is being deposited onto one or more substrates. Real-time control over (and variance of) parameters that affect cracking efficiency may be desirable in systems where one or more parameters (e.g., pressures, temperatures, etc.) vary over time.

A method for optimizing a cracking efficiency with which a pyrolysis tube of a deposition apparatus cracks a precursor material into reactive species, is disclosed including measuring an input pressure at an entrance to the pyrolysis tube, outside of the pyrolysis tube; measuring an output pressure at an exit from the pyrolysis tube, outside of the pyrolysis tube; measuring a pyrolysis temperature within the pyrolysis tube; calculating a cracking efficiency based on the input pressure, the output pressure and the pyrolysis temperature; and determining an adjustment to be made to at least one of the input pressure, the output pressure and the pyrolysis temperature to increase the cracking efficiency.

In some embodiments, the method further includes adjusting at least one of the input pressure, the output pressure the pyrolysis temperature in accordance with the adjustment to be made to increase the cracking efficiency.

In some embodiments, the method further includes determining a pressure differential between the input pressure and the output pressure.

In some embodiments, the method further includes calculating a residence time that the precursor material remains within the pyrolysis tube with the pressure differential.

In some embodiments, calculating the residence time includes employing the following formula:

$$\Delta t = t_0 (P_1 - P_2)^{-\beta},$$

where $\Delta t$ is the residence time, $(P_1 - P_2)$ is pressure differential between the input pressure and the output pre, $t_0$ is an experimentally determined pre-factor for the residence time and corresponds specifically to the pyrolysis tube and $\beta$ is an experimentally determined exponent that corresponds specifically to the pyrolysis tube.

In some embodiments, calculating the cracking efficiency ($\eta$) includes employing the following formula:

$$\eta = 1 - e^{-\lambda \Delta t},$$

where e is Euler's number and $\lambda$ is a reaction rate at which molecules of the precursor material are cracked into reactive species.

In some embodiments, identifying the adjustment to be made includes identifying a pyrolysis temperature that does not exceed a predetermined maximum threshold pyrolysis temperature.

In some embodiments, identifying the adjustment to be made includes identifying a pyrolysis temperature that does not exceed 680° C.

In some embodiments, identifying the adjustment to be made includes identifying a residence time that is at least as great as a predetermined minimum threshold residence time.

In some embodiments, identifying the adjustment to be made includes identifying a residence time that is at least 0.1 second.

A method for determining a cracking efficiency of a pyrolysis tube of a material deposition apparatus is disclosed including determining a pyrolysis tube-dependent pre-factor for residence time; and determining a pyrolysis tube-dependent exponential constant.

In some embodiments, determining the pyrolysis tube-dependent exponential constant includes experimentally determining the pyrolysis tube-dependent exponential constant.

In some embodiments, experimentally determining the pyrolysis tube-dependent exponential constant and determining the pyrolysis tube-dependent pre-factor for residence time includes determining residence time of a plurality of different precursor material load amounts in the pyrolysis tube; determining a logarithm of the residence time corresponding to each precursor material load amount of the plurality of precursor material load amounts; determining a pressure drop within the pyrolysis tube corresponding to each precursor material load amount of the plurality of precursor material load amounts; determining a logarithm of the pressure drop within the pyrolysis tube corresponding to each precursor material load amount; plotting a data point for each precursor material load amount, the data point including a plot of the logarithm of the residence time corresponding to the precursor material load amount against the logarithm of the pressure drop within the pyrolysis tube corresponding to the precursor material load amount; identifying a best-fit line through a plurality of data points corresponding to the plurality of precursor material load amounts; and setting an equation for the best-fit line equal to $\Delta t = t_0 (P_1 - P_2)^{-\beta}$, where P1–P2 is the pressure drop within the pyrolysis tube, $t_0$ is the pyrolysis tube-dependent pre-factor for residence time and $\beta$ is the pyrolysis tube-dependent exponential constant.

A method for optimizing a cracking efficiency of a pyrolysis tube of a material deposition apparatus is disclosed, including determining at least one of a residence time and a pyrolysis temperature that provide a desired cracking efficiency for a pyrolysis tube having a specified pre-factor for residence time and a specified exponential constant; and operating the pyrolysis tube in a manner that enables a precursor material to be heated to the pyrolysis temperature and/or that enables the precursor material to remain within the pyrolysis tube for the residence time.

In some embodiments, determining at least one of the residence time and the pyrolysis temperature includes use of the equation:

$$\eta = 1 - e^{-\lambda \Delta t}$$

where $\eta$ is the cracking efficiency, $\lambda$ is a reaction rate, and is based in part on the pyrolysis temperature, and $\Delta t$ is the residence time.

In some embodiments, determining at least one of the residence time and the pyrolysis temperature further includes use of the equation:

$$\lambda = 4\rho \pi d^2 \frac{P_1}{kT_v} \sqrt{\frac{8kT_p}{\pi \mu}} e^{-\frac{E_a}{kT_p}}$$

where $T_p$ is the pyrolysis temperature, $\rho$ is a steric factor, d is an equivalent diameter for a molecule of precursor material, k is the Boltzmann constant, $\mu$ is a reduced mass of the precursor material and a monomer formed therefrom, $E_a$ is an activation energy for the precursor material and $P_1$ is a pressure at a first end of the pyrolysis tube.

In some embodiments, determining at least one of the residence time and the pyrolysis temperature further includes use of the equation:

$$\lambda = 4\rho \pi d^2 \frac{P_1}{kT_v} \sqrt{\frac{8kT_p}{\pi \mu}} e^{-\frac{E_a}{kT_p}}$$

where $P_1 - P_2$ is the pressure drop within the pyrolysis tube, $t_0$ is the pyrolysis tube-dependent pre-factor for residence time and $\beta$ is the pyrolysis tube-dependent exponential constant.

Other aspects, as well as features and advantages of various aspects, of the disclosed subject matter will become apparent to those of ordinary skill in the art through consideration of the ensuing description and the appended claims.

DETAILED DESCRIPTION

Reference will now be made in detail to exemplary embodiments of the disclosed subject matter, examples of which are illustrated in the accompanying drawings. The method and corresponding steps of the disclosed subject matter will be described in conjunction with the detailed description of the system.

During deposition of the polymer, the preference is for the deposition of a strong and clear coating. However, dynamics within the pyrolyzer may affect the characteristics of the polymer.

The performance of the pyrolyzer may be characterized in terms of its cracking efficiency, η, defined as the ratio of the amount of dimer that is pyrolyzed to the total dimer load for a given deposition process, $$\eta = \frac{M_i - M_f}{M_i} \quad \text{(Eq. 1)}$$

where $M_i$ and $M_f$ are the amounts of dimer introduced into the pyrolyzer and exiting the pyrolyzer, respectively. In an ideal case, cracking efficiency η should be 100% while a polymer is being deposited onto a surface of a substrate.

In practical operation, there are difficulties associated with operation of the pyrolyzer to achieve and maintain 100% cracking efficiency. Two undesired scenarios may arise, namely "under-cracking" and "over-cracking."

When under-cracking occurs, a mixture of un-cracked dimer and monomer exits the pyrolyzer, with the un-cracked dimer quickly condensing onto surfaces between the pyrolyzer and the deposition chamber and onto cooler surfaces in the deposition chamber. The heavy dimer deposits that are formed on these surfaces can adversely affect performance of the material deposition equipment, and undesirably increase the frequency with which the material deposition equipment must be cleaned and maintained.

Under-cracking also can result in low dimer utilization, meaning that the polymer coating may be undesirably thin or that the formation of a polymer coating of desired thickness may be undesirably slow. Additionally, when the dimer is not sufficiently cracked by the pyrolyzer, dimer may be present within, and contaminate, the polymer coating, which may undesirably affect the quality of the polymer coating.

When over-cracking occurs, the monomer molecules are further dissociated into degraded monomers with lower molecular weights, as well unwanted products such as chlorine gas ($Cl_2$). Chlorine gas and moisture can readily form hydrochloric acid (HCl), which can corrode the surfaces of the material deposition equipment that the hydrochloric acid contacts. In addition, degraded monomers may deposit onto surfaces of the material deposition equipment, which can adversely affect its performance and undesirably increase the frequency with which the equipment must be cleaned and maintained.

Figure 2:
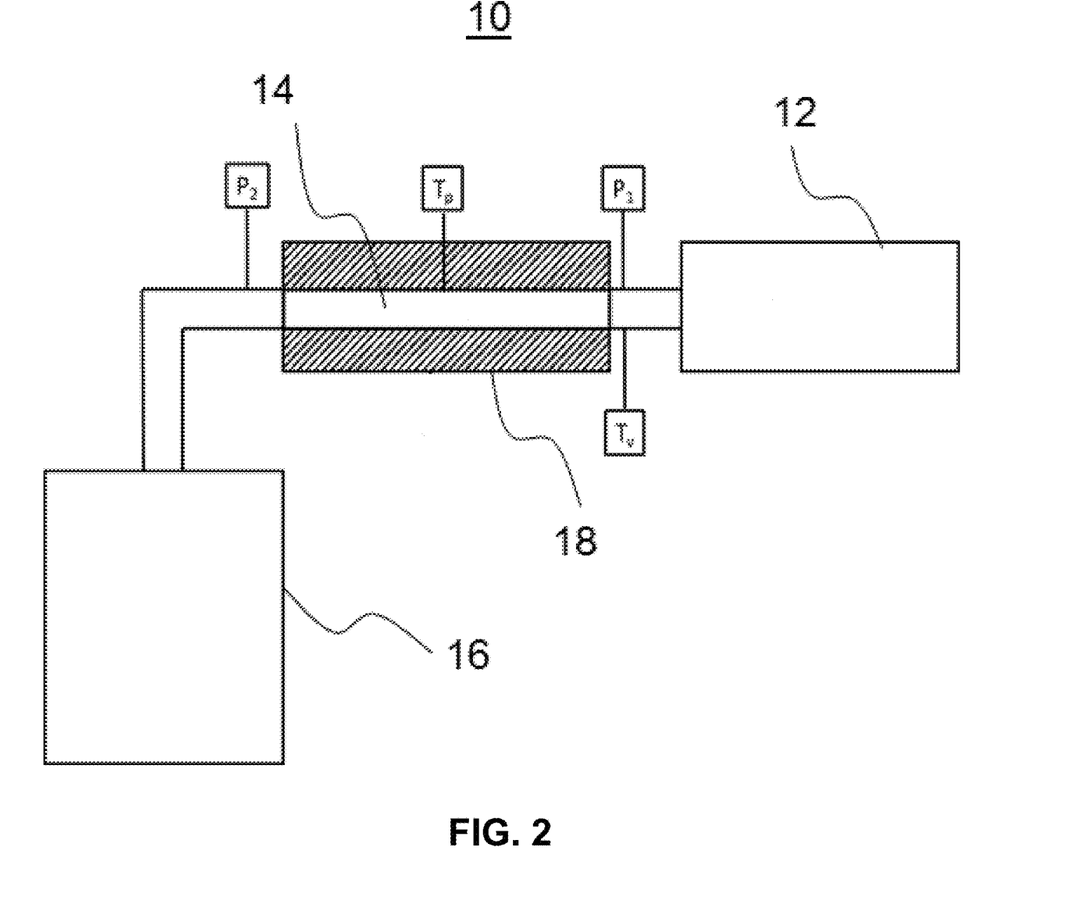
FIG. 2 illustrates material deposition equipment in accordance with an exemplary embodiment of the disclosed subject matter.

An embodiment of material deposition equipment 10 in accordance with an embodiment of this disclosure is depicted by FIG. 2. The material deposition equipment 10 is useful in connection with embodiments of the methods described herein. The material deposition equipment includes a vaporizer 12, a pyrolyzer 14 and a deposition chamber 16. The vaporizer 12 receives a precursor material, such as a parylene dimer, and vaporizes or sublimates the precursor material. The pyrolyzer 14, which includes a heater 18, cracks the precursor material into active species, such as monomers. The deposition chamber 16 holds one or more substrates, and receives active species from the pyrolyzer 14 to enable the active species to deposit onto surfaces of the one or more substrates and to form a polymer on surfaces of the one or more substrates.

In FIG. 2, $P_1$ represents the input pressure at an entrance to the pyrolysis tube 14, outside of the pyrolysis tube, or the "inlet pressure," and $P_2$ represents the output pressure at an exit from the pyrolysis tube 14, outside of the pyrolysis tube, or "exit pressure." $T_v$ represents the vaporization temperature at the entrance to the pyrolysis tube, outside of the pyrolysis tube, or the "inlet temperature." $T_p$ represents the temperature within the pyrolyzer tube 14, or the "pyrolyzer temperature." Temperature may be measured in any suitable manner. Without limitation, the pyrolyzer temperature, $T_p$, may be measured by thermocouples that are in close proximity to the wall of the pyrolyzer.

The cracking efficiency η of the pyrolyzer is represented by the following equation:

$$\eta = 1 - e^{-\lambda \Delta t} \quad \text{(Eq. 2)}$$

where Δt is the residence time of dimer molecules in the pyrolyzer 14 and λ is the reaction rate. In terms of the process parameters identified in FIG. 2 (i.e., $P_1$, $P_2$, $T_v$, and $T_p$), Δt and λ are represented by the following equations:

$$\Delta t = t_0 (P_1 - P_2)^{-\beta} \quad \text{(Eq. 3a)}$$

$$\lambda = 4\rho\pi d^2 \frac{P_1}{kT_v} \sqrt{\frac{8kT_p}{\pi\mu}} e^{-\frac{E_a}{kT_p}} \quad \text{(Eq. 3b)}$$

where:
- $t_0$ a pre-factor for residence time, is dependent on specific material deposition equipment (see exemplary embodiment at APPENDIX B);
- β is an experimentally determined exponent, which is also tool dependent (e.g., β≈0.9 on the material deposition equipment used to provide the data disclosed herein) (see exemplary embodiment at APPENDIX B);
- ρ a steric factor (e.g., ρ~1);
- d an equivalent diameter of the dimer molecule (e.g., d≈1 nm);
- k Boltzmann constant;
- μ reduced mass of dimer and monomer (e.g., μ=92.3 a.u. for parylene C dimer);
- $E_a$ activation energy (e.g., $E_a$≈1.25 eV for parylene C dimer; $E_a$ may be about 0.98 eV for other precursor materials; $E_a$ may be 0.1 to 2.0 for various other precursor materials.)

Figure 3:
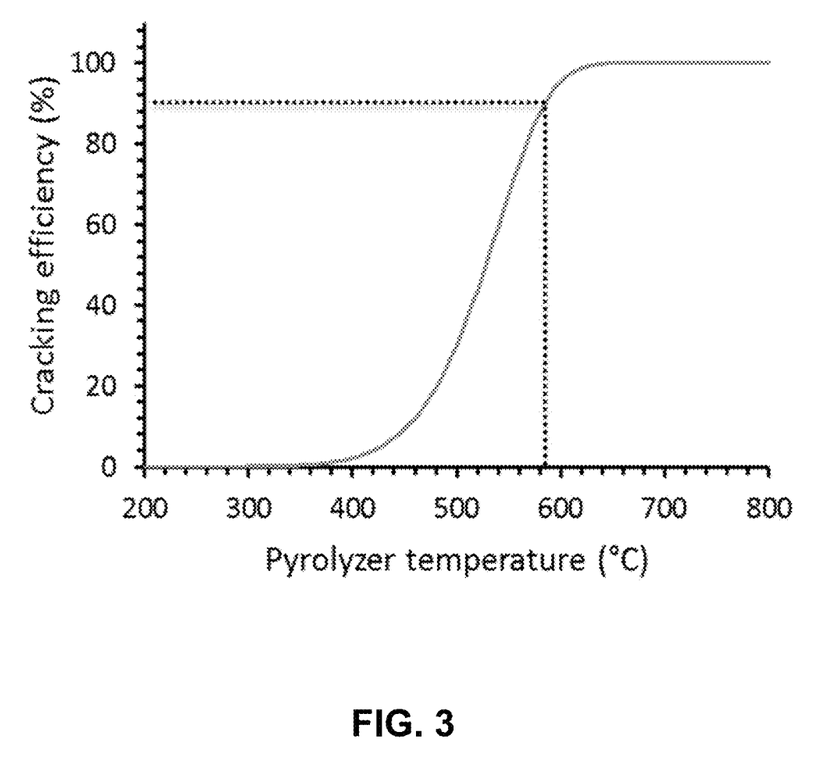
FIG. 3 is graph illustrating cracking efficiency as a function of pyrolyzer temperature in accordance with an exemplary embodiment of the disclosed subject matter.

As indicated by Eq. 3b and Eq. 2, above, the cracking efficiency, η, is dependent upon the pyrolyzer temperature, $T_p$. This relationship is further illustrated by the graph of FIG. 3, which shows cracking efficiency data obtained using WB5000 material deposition equipment available from HZO, Inc., of Draper, Utah, with parylene C at a residence time, Δt, of 0.12 s. As illustrated by the dotted lines in FIG. 3, when the pyrolyzer of that material deposition equipment is heated to a pyrolyzer temperature, $T_p$, of 590° C., the pyrolyzer and, thus, of the material deposition equipment cracks parylene C with an efficiency of about 90%.

Figure 4:
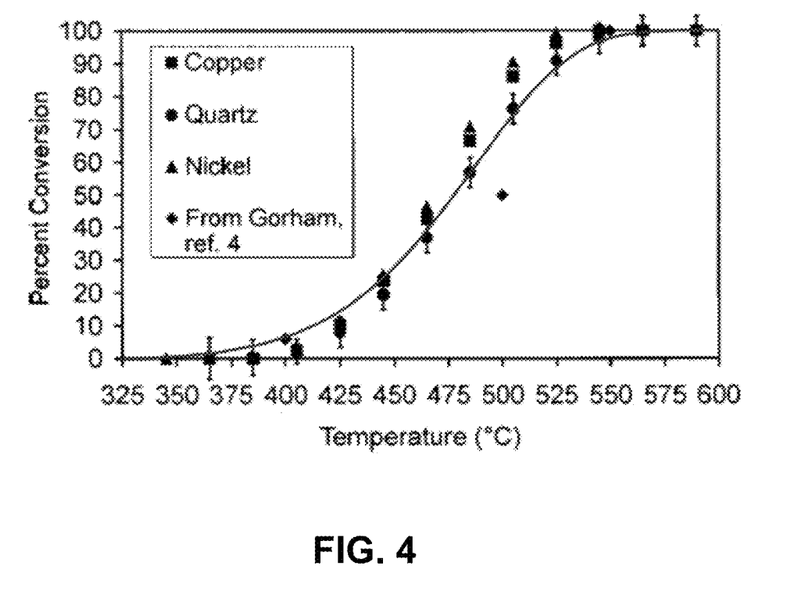
FIG. 4 is a graph illustrating cracking efficiency as a function of pyrolyzer temperature in accordance with an exemplary embodiment of the disclosed subject matter.

The cracking efficiency may change with a change in residence time, Δt. As an example, when residence time, Δt, is increased to 0.4 s., the cracking efficiency η may increase at a variety of different pyrolyzer temperatures, $T_p$. This result is illustrated by the graph of FIG. 4, in which the curve represents a calculated cracking efficiency η (i.e., "percent conversion") and the symbols are experimental data points from Fortin, J. B., et al., J. Vac. Sci. Technol., A 18, 2459 (2000), wherein the cracking efficiency was determined with different materials as the liner in their pyro tube. The cracking efficiency η may be almost 100% at a pyrolyzer temperature, $T_p$, of 550° C. In some embodiments, the cracking efficiency may be set at a value of less than 100%

(e.g., 98%, 95%, 92%, 90%, etc.). Even at a pyrolyzer temperature, $T_p$, of 450° C., nearly 20% of dimer is converted into monomers.

Notably, Eq. 2 does not provide any indication regarding the extent over-cracking. In fact, when cracking efficiency η approaches 100%, significant over-cracking is expected to occur. The effective conversion efficiency χ can be defined as $$\chi = \frac{\text{total amount of non-degraded monomer}}{2 \times \text{total amount of dimer}} \quad \text{(Eq. 4)}$$

APPENDIX A (eq. A18) provides an approximation of χ as $$\chi = (1 - e^{-\lambda \Delta t}) e^{-\lambda' \Delta t} \quad \text{(Eq. 5)}$$

where λ is defined in Eq. 3b, and $$\lambda' = 4\rho \pi d^2 \frac{P_1}{kT_v} \sqrt{\frac{8kT_p}{\pi \mu}} e^{-\frac{E_b}{kT_p}} \quad \text{(Eq. 6)}$$

Figure 5:
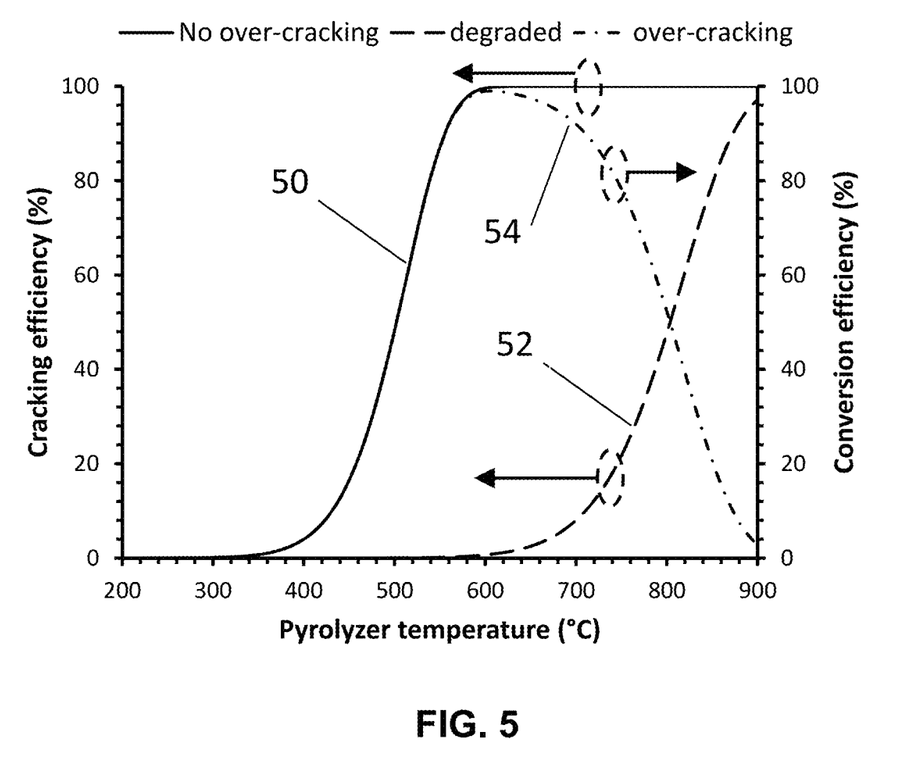
FIG. 5 is a graph illustrating cracking efficiency and conversion efficiency as a function of pyrolyzer temperature in accordance with an exemplary embodiment of the disclosed subject matter.
Figure 6:
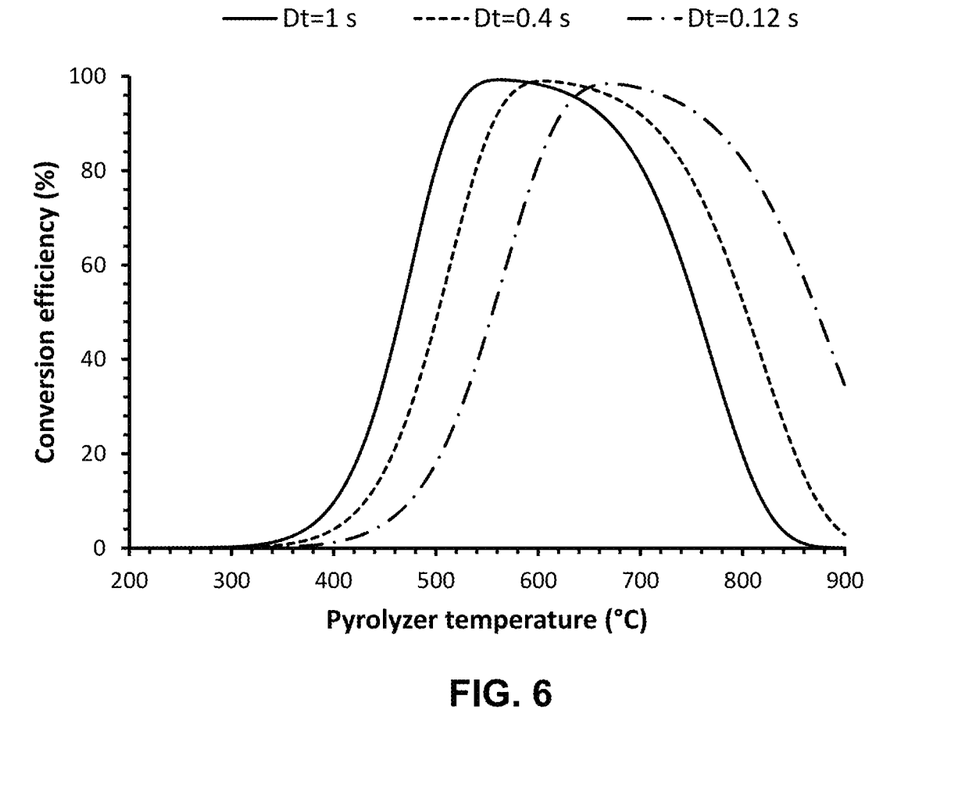
FIG. 6 is a graph illustrating conversion efficiency as a function of pyrolyzer temperature in accordance with an exemplary embodiment of the disclosed subject matter.

FIGS. 5 and 6 show the effect of over-cracking on the effective conversion efficiency:

FIG. 5 shows the difference between cracking efficiency η and effective conversion efficiency χ. Line 50 represents cracking efficiency η with no over-cracking and line 52 represents cracking efficiency η with over-cracking. (Cracking efficiency η denoted on Y-axis on left side of FIG. 5) Line 54 represents the difference between no over-cracking and with over-cracking, which is the conversion efficiency χ. (Conversion efficiency χ denoted on Y-axis on right side of FIG. 5.)

FIG. 6 shows the effect of residence time when over-cracking is considered. It can be seen that: (a) over-cracking occurs at a wide range of pyrolyzer temperatures; (b) the longer the residence time Dt, the lower the onset temperature of over-cracking; and (c) the maximum effective conversion efficiency is usually lower than 100%.

Figure 7:
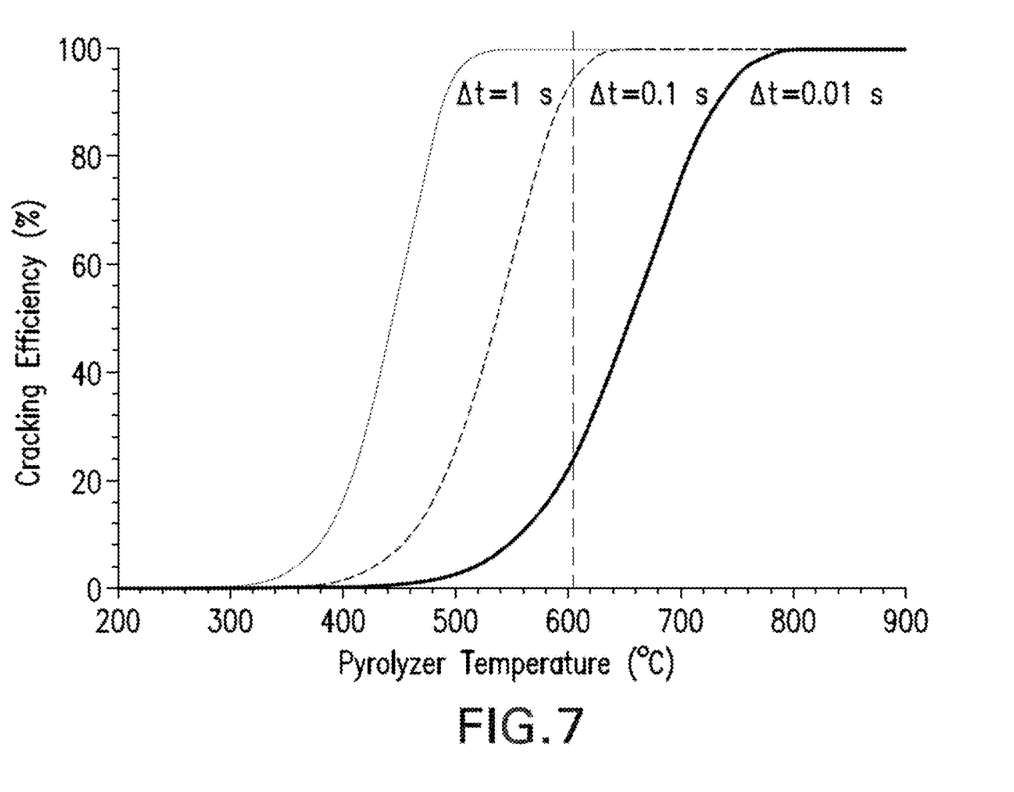
FIG. 7 is a graph illustrating the dependence of cracking efficiency on temperature at different residence times in accordance with an exemplary embodiment of the disclosed subject matter.

FIG. 7 shows the dependence of cracking efficiency on temperature at different residence times Δt due to different pressure drops $P_1 - P_2$ across the pyrolyzer. It can be seen that, at a given pyrolyzer temperature $T_p$ when the residence time Δt decreases, the cracking efficiency also decreases. For example, when the pyrolyzer temperature $T_p$ is 600° C., at a residence time Δt of 1 s, the cracking efficiency is 100%; at a residence time Δt of 0.1 s, the cracking efficiency is about 90%; and at a residence time, Δt, of 0.01 s, =0.1 s, the cracking efficiency is only about 25%.

Figure 8:
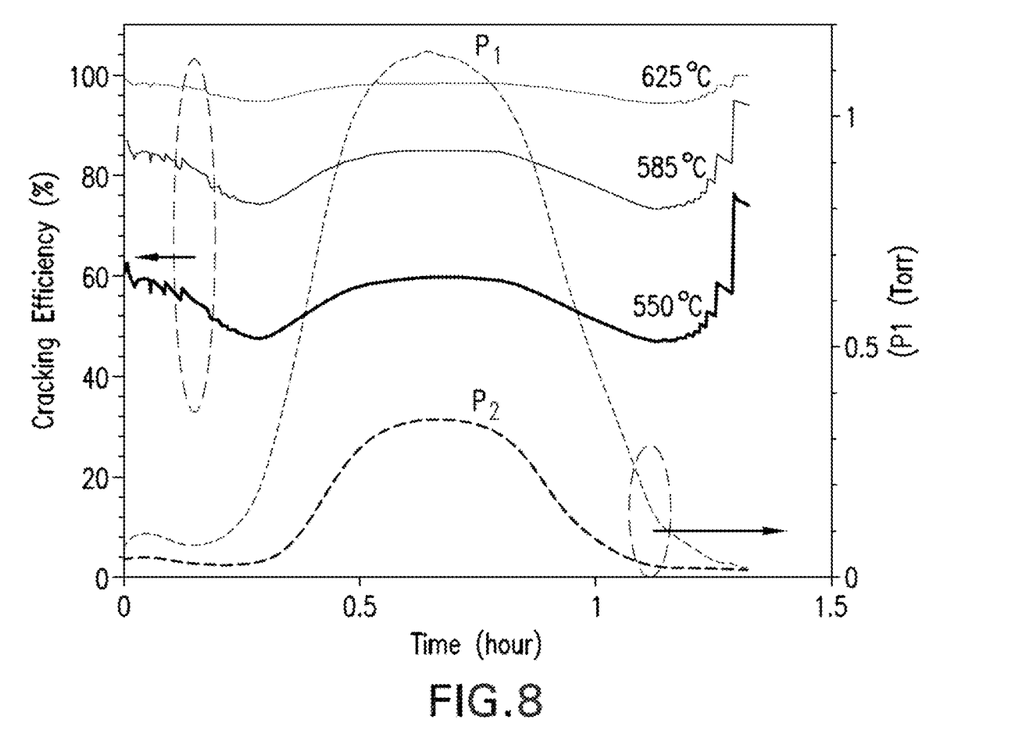
FIG. 8 illustrates examples of variation of cracking efficiency during actual depositions of polyp-xylylene) in accordance with an exemplary embodiment of the disclosed subject matter.

FIG. 8 illustrates examples of variation of cracking efficiency during actual depositions of polyp-xylylene) using WB5000 material deposition equipment available from HZO, Inc., of Draper, Utah. The cracking efficiency were determined over the course of three different deposition courses, a first at a pyrolyzer temperature, $T_p$, of 550° C., a second at a pyrolyzer temperature, $T_p$, of 585° C. and a third at a pyrolyzer temperature, $T_p$, of 625° C. Due to uncertainty over the rate constant for over-cracking, the calculations represented by the curves of FIG. 8 are calculated without correction for over-cracking. If over-cracking were taken into account, the effective conversion efficiency would be lower than those illustrated by FIG. 8.

When polyp-xylylene) is deposited, even at a fixed pyrolysis temperature, $T_p$, as depicted by FIG. 8, under-cracking and over-cracking will occur at different points or stages during the deposition process. Accordingly, in some embodiments, a model according to this disclosure may be used to repeatedly or even continuously optimize cracking efficiency throughout the course of a deposition process, and one or both of the pyrolyzer temperature and the residence time, Δt, (i.e., the inlet pressure, $P_1$, and/or the exit pressure, $P_2$) may be adjusted to maintain or substantially maintain a particular (e.g., a maximum, etc.) cracking efficiency.

A semi-empirical model for optimizing cracking efficiency may be based on collision theory. This model can be applied to process optimization by real time monitoring and adjustment of process parameters.

APPENDIX A

Derivation of Cracking Efficiency

The process of pyrolysis can be understood within the general framework of the collision theory of gas phase chemical reactions. The vapor in a pyrolyzer is usually a mixture of dimer and monomer molecules. For C-dimer, denoting the dimer and monomer as D and M respectively, the possible reactions are

D+D→4 M (A1)

M+D→M+2M (A2)

M+M→D (A3)

M+M→M+M*+Cl (A4)

Reaction A4 refers to over-cracking, in which the C—Cl bond in a monomer is broken. M* denotes degraded monomer due to over-cracking.

For parylene C dimer, at a pyrolysis temperature, $T_p$, of more than 500° C., the re-dimerization (reaction A3) can be neglected. Also, since the bond strength of C—Cl bond is much stronger than the strained C—C bond, it can be assumed that no over-cracking occurs within this framework.

Under these assumptions, the rate equation becomes, $$\frac{d[M]}{dt} = 4k_{DD}[D]^2 + 2k_{MD}[D][M] \quad \text{(eq. A1)}$$

where [D] and [M] are the molar concentration of the dimer and monomer molecules. They are related as $$[D] + \frac{[M]}{2} = [D]_0 \quad \text{(eq. A2)}$$

where $[D]_0$ is the initial dimer concentration at pyrolyzer entry. Combining Eq. A1 and Eq. A2, the rate equation becomes $$\frac{d[M]}{dt} = 4\{(k_{DD} - k_{MD})[D] + k_{MD}[D]_0\} \cdot [D] \quad \text{(eq. A3)}$$

The two rate constants, $k_{MD}$ and $k_{DD}$, are $$k_{MD} = \rho \pi d_{MD}^2 \sqrt{\frac{8kT_p}{\pi \mu_{MD}}} e^{-\frac{E_a}{kT_p}} \cdot N_A \quad \text{(eq. 4A)}$$

$$k_{DD} = \rho \pi d_{DD}^2 \sqrt{\frac{8kT_p}{\pi \mu_{DD}}} e^{-\frac{E'_a}{kT_p}} \cdot N_A \quad \text{(eq. A5)}$$

where:
ρ is a steric factor (e.g., ρ~1);
$d_{MD}$ is a radius of the cross section for a dimer-monomer collision;
$d_{DD}$ is a radius of the cross-section for a dimer-dimer collision;
$T_p$ is the pyrolyzer temperature;
$\mu_{MD}$ is a reduced mass of dimer-monomer pair;
$\mu_{DD}$ is a reduced mass of dimer-dimer pair;
$E_a$ is an activation energy for a dimer-monomer collision;
$E'_a$ is an activation energy for a dimer-dimer collision;
k is the Boltzmann constant; and
$N_A$ is the Avagadro constant.

For parylene C dimer, $k_{MD}$ and $k_{DD}$ are rather similar, therefore the first term in Eq. A3 is much smaller than the second term, i.e., $$(k_{DD}-k_{MD})[D] \ll k_{MD}[D]_0 \quad \text{(eq. A6)}$$

Therefore, the rate equation reduces to $$\frac{d[M]}{dt} = 4k_{MD}[D]_0 \cdot [D] \quad \text{(eq. A7)}$$

Note that $$\frac{d[M]}{dt} = -2\frac{d[D]}{dt} \quad \text{(eq. A8)}$$

We have, $$\frac{d[D]}{dt} = -2k_{MD}[D]_0 \cdot [D] \quad \text{(eq. A9)}$$

$[D]_0$ can be calculated from process parameters as, $$[D]_0 = \frac{P_1}{RT_v}, \quad \text{(eq. A10)}$$

where R is the ideal gas constant, R=8.31 J·K$^{-1}$·mol$^{-1}$. $T_v$ is the vapor temperature at the pyrolyzer entry. Let λ=2 $k_{MD}[D]_0$, the rate equation becomes $$\frac{d[D]}{dt} = -\lambda[D] \quad \text{(eq. A11)}$$

By solving this equation and integrating from $t_0$ to $(t_0+\Delta t)$, where Δt is the residence time of the vapor molecules, we have $$[D]=[D]_0 e^{-\lambda \Delta t} \quad \text{(eq. A12)}$$

The cracking efficiency, η, can be calculated as $$\eta = \frac{[D]_0 - [D]}{[D]_0} = 1 - e^{-\lambda \Delta t} \quad \text{(eq. A13)}$$

When deriving the cracking efficiency (Eq. A13), the loss of monomer to over-cracking is not considered. This is justified because the C—Cl bond is much stronger than the strained C—C bond, and requires much higher activation energy in the rate constant. However, when cracking efficiency is high, the vapor near the pyrolyzer exit consists of dominantly monomer molecules, and over-cracking can be significant. Here, an estimate of over-cracking efficiency, χ, is given.

Following similar procedures, the rate equation for over-cracking is $$\frac{d[M]}{dt} = 4k_{DD}[D]^2 + 2k_{MD}[D][M] - 2k_{MM}[D]_0[M] \quad \text{(eq. A14)}$$

$$k_{MM} = \rho \pi d_{MM}^2 \sqrt{\frac{8kT_p}{\pi \mu_{MM}}} e^{-\frac{E_b}{kT_p}} \cdot N_A \quad \text{(eq. A15)}$$

Here, only the collisions between monomers are considered to contribute to over-cracking, since collisions between dimer and monomer will most likely produce monomers. Also, it is assumed that both "good" monomer and degraded monomer contribute to over-cracking. $E_b$ in Eq. A15 is the activation energy of over-cracking, and $E_b > E_a$.

Specifically, for parlyene C dimer:

$$k_{MM} \ll k_{MD} \quad \text{(eq. A16)}$$

Under this condition, an approximate form of [M] can be written as $$[M]=2[D]_0(1-e^{-\lambda \Delta t})e^{-\lambda' t} \quad \text{(eq. A17)}$$

and the effective conversion efficiency is $$\chi = \frac{[M]}{2[D]_0} = (1 - e^{-\lambda t})e^{-\lambda' t} \quad \text{(eq. A18)}$$

Where $$\lambda'=2k_{MM}[D]_0 \quad \text{(eq. A19)}$$

APPENDIX B

Determination of the Values of $t_0$ and β in Eq. (3a) on R&D WB5000

The residence time at different dimer loads was determined, and the data is fitted according to Eq. 3a, above. The data analyzed included the residence time Δt of a plurality of different precursor material load amounts in the pyrolysis tube. A logarithm of the residence time corresponding to each precursor material load amount of the plurality of precursor material load amounts was then calculated. A pressure drop ($P_1-P_2$) within the pyrolysis tube corresponding to each precursor material load amount of the plurality of precursor material load amounts was determined, and a logarithm of the pressure drop within the pyrolysis tube corresponding to each precursor material load amount was calculated.

Subsequently, data points for each precursor material load amount were plotted Each data point was a plot of the logarithm of the residence time Δt corresponding to the precursor material load amount against the logarithm of the pressure drop (P1–P2) within the pyrolysis tube corresponding to the precursor material load amount. A best fit line was determined through a plurality of data points corresponding to the plurality of precursor material load amounts.

An equation for the best fit line was set equal to $$\Delta t = t_0 (P_1 - P_2)^{-\beta} \quad \text{(Eq. 3a)}$$

where t0 is the pyrolysis tube dependent pre factor for residence time and β is the pyrolysis tube dependent exponential constant.

Figure 9:
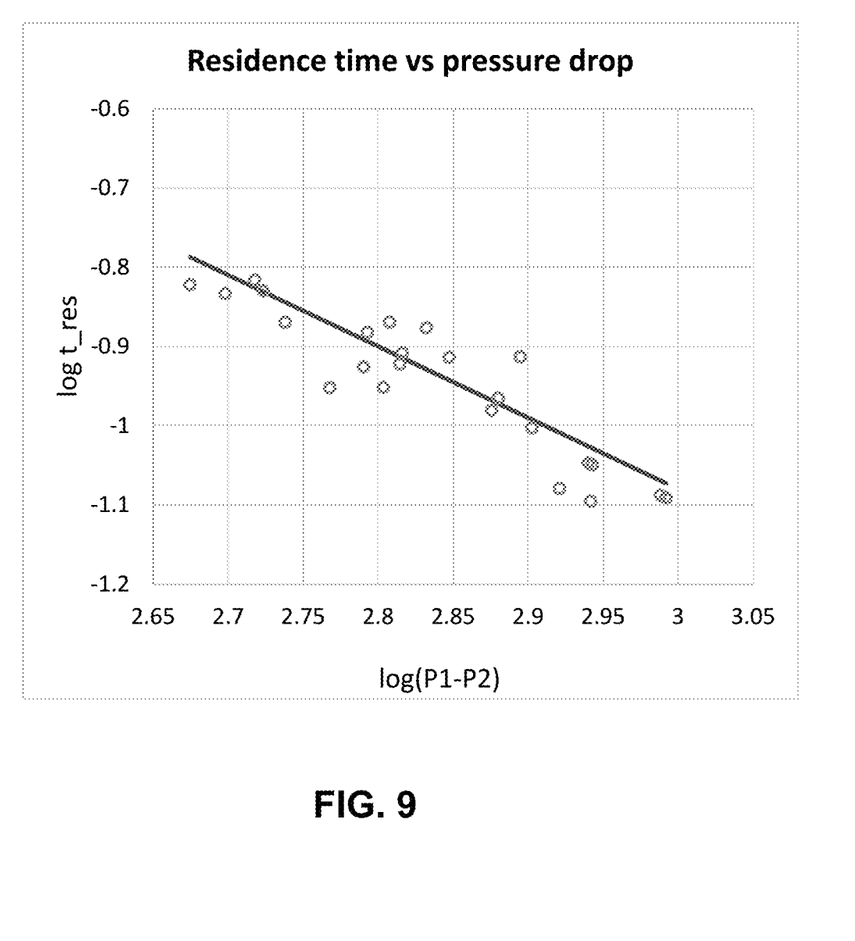
FIG. 9 illustrates a representation of pressures and residence times from experimental data in accordance with an exemplary embodiment of the disclosed subject matter.

Table 1 shows the experimental data. FIG. 9 shows the fit to the data according to Eq. 3a. The values of $t_0$ and β are found to be:

$$t_0 = 41.7 \text{ s}$$

$$\beta = 0.9$$

TABLE 1

Residence time as a function of the pressure drop, $P_1$-$P_2$.

| P1-P2 | 1/(P1-P2) | log (P1-P2) | Res. Time (s) | log (Res time) | Fit |
|---|---|---|---|---|---|
| 751 | 0.001332 | 2.875639937 | 0.104533 | −0.980745302 | −0.96808 |
| 759 | 0.001318 | 2.880241776 | 0.108339 | −0.965213308 | −0.97222 |
| 799 | 0.001252 | 2.902546779 | 0.099307 | −1.003018425 | −0.99229 |
| 833.5 | 0.0012 | 2.920905604 | 0.083313 | −1.079288996 | −1.00882 |
| 617 | 0.001621 | 2.790285164 | 0.118616 | −0.925856391 | −0.89126 |
| 871 | 0.001148 | 2.940018155 | 0.089701 | −1.04720038 | −1.02602 |
| 874.5 | 0.001144 | 2.941759814 | 0.080277 | −1.095408567 | −1.02758 |
| 973.2 | 0.001028 | 2.9882021 | 0.081653 | −1.088028426 | −1.06938 |
| 981.7 | 0.001019 | 2.991978791 | 0.081087 | −1.091047949 | −1.07278 |
| 876.5 | 0.001141 | 2.94275192 | 0.089249 | −1.049398169 | −1.02848 |
| 472.78 | 0.002115 | 2.674659096 | 0.150622 | −0.822110256 | −0.78719 |
| 679.5 | 0.001472 | 2.832189461 | 0.132871 | −0.876569915 | −0.92897 |
| 642.3 | 0.001557 | 2.807737922 | 0.13505 | −0.869505354 | −0.90696 |
| 620.64 | 0.001611 | 2.792839762 | 0.131052 | −0.88255775 | −0.89356 |
| 652.4 | 0.001533 | 2.814513952 | 0.119542 | −0.922477871 | −0.91306 |
| 784.8 | 0.001274 | 2.894758994 | 0.122159 | −0.91307577 | −0.98528 |
| 703.5 | 0.001421 | 2.847264102 | 0.121932 | −0.913882493 | −0.94254 |
| 529 | 0.00189 | 2.723455672 | 0.147983 | −0.829787 | −0.83111 |
| 522 | 0.001916 | 2.717670503 | 0.152662 | −0.816267722 | −0.8259 |
| 547 | 0.001828 | 2.737987326 | 0.135026 | −0.869583368 | −0.84419 |
| 499 | 0.002004 | 2.698100546 | 0.146723 | −0.833500528 | −0.80829 |
| 586 | 0.001706 | 2.767897616 | 0.111628 | −0.95222858 | −0.87111 |
| 636 | 0.001572 | 2.803457116 | 0.111754 | −0.951738657 | −0.90311 |
| 655 | 0.001527 | 2.8162413 | 0.123517 | −0.908272963 | −0.91462 |

While the disclosed subject matter is described herein in terms of certain preferred embodiments, those skilled in the art will recognize that various modifications and improvements may be made to the disclosed subject matter without departing from the scope thereof.

In addition to the specific embodiments claimed below, the disclosed subject matter is also directed to other embodiments having any other possible combination of the dependent features claimed below and those disclosed above. As such, the particular features presented in the dependent claims and disclosed above can be combined with each other in other manners within the scope of the disclosed subject matter such that the disclosed subject matter should be recognized as also specifically directed to other embodiments having any other possible combinations. Thus, the foregoing description of specific embodiments of the disclosed subject matter has been presented for purposes of illustration and description. It is not intended to be exhaustive or to limit the disclosed subject matter to those embodiments disclosed.

What is claimed:

1. A method for optimizing a cracking efficiency with which a pyrolysis tube of a deposition apparatus cracks a precursor material into reactive species, comprising:
    measuring an input pressure of the pyrolysis tube;
    measuring an output pressure of the pyrolysis tube;
    measuring a pyrolysis temperature within the pyrolysis tube;
    calculating a cracking efficiency based on the input pressure, the output pressure, and the pyrolysis temperature; and
    adjusting at least one of the input pressure, the output pressure, or the pyrolysis temperature to maintain a particular cracking efficiency, wherein adjusting comprises increasing or decreasing one of the input pressure of the pyrolysis tube, the output pressure of the pyrolysis tube, or the pyrolysis temperature within the pyrolysis tube to maintain the particular cracking efficiency.

2. The method of claim 1, further comprising:
    measuring a vaporization temperature at the entrance to the pyrolysis tube, outside of the pyrolysis tube;
    calculating the cracking efficiency based on the input pressure, the output pressure, the vaporization temperature, or the pyrolysis temperature.

3. The method of claim 1, further comprising:
    determining a pressure differential between the input pressure and the output pressure.

4. The method of claim 3, further comprising:
    calculating a residence time that the precursor material remains within the pyrolysis tube with the pressure differential.

5. The method of claim 4, wherein calculating the residence time comprises employing the following formula:

$$\Delta t = t_0 (P_1 - P_2)^{-\beta},$$

where Δt is the residence time, ($P_1$-$P_2$) is pressure differential between the input pressure and the output pre, to is an experimentally determined pre-factor for the residence time and corresponds specifically to the pyrolysis tube and β is an experimentally determined exponent that corresponds specifically to the pyrolysis tube.

6. The method of claim 5, wherein calculating the cracking efficiency comprises employing the following formula:

$$\eta = 1 - e^{-\lambda \Delta t},$$

where η is cracking efficiency, e is Euler's number and λ is a reaction rate at which molecules of the precursor material are cracked into reactive species.

7. The method of claim 1, further comprising identifying an adjustment to be made that comprises identifying a residence time that is at least as great as a predetermined minimum threshold residence time.

8. The method of claim 7, further comprising identifying an adjustment to be made that comprises identifying a residence time that is at least 0.1 second.

* * * * *